United States Patent
Kasamatsu et al.

(10) Patent No.: US 10,930,584 B2
(45) Date of Patent: Feb. 23, 2021

(54) ELECTRONIC COMPONENT AND THREE-TERMINAL CAPACITOR

(71) Applicant: Murata Manufacturing Co., Ltd., Nagaokakyo (JP)

(72) Inventors: Terutoki Kasamatsu, Nagaokakyo (JP); Syuichi Nabekura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 113 days.

(21) Appl. No.: 16/263,213

(22) Filed: Jan. 31, 2019

(65) Prior Publication Data
US 2019/0164884 A1   May 30, 2019

Related U.S. Application Data

(63) Continuation of application No. PCT/JP2017/039507, filed on Nov. 1, 2017.

(30) Foreign Application Priority Data

Nov. 14, 2016 (JP) .............................. JP2016-221516

(51) Int. Cl.
*H01L 23/00* (2006.01)
*H01L 23/522* (2006.01)
(Continued)

(52) U.S. Cl.
CPC .......... *H01L 23/5223* (2013.01); *H01G 2/02* (2013.01); *H01G 4/005* (2013.01); *H01G 4/228* (2013.01);
(Continued)

(58) Field of Classification Search
None
See application file for complete search history.

(56) References Cited

U.S. PATENT DOCUMENTS

2011/0127680 A1   6/2011   Masuda et al.
2015/0061104 A1   3/2015   Takahashi et al.

FOREIGN PATENT DOCUMENTS

JP           11-4080 A     1/1999
JP      2005-340535 A    12/2005
(Continued)

OTHER PUBLICATIONS

Official Communication issued in International Patent Application No. PCT/JP2017/039507, dated Jan. 9, 2018.

*Primary Examiner* — Reema Patel
(74) *Attorney, Agent, or Firm* — Keating & Bennett, LLP (57) ABSTRACT

In an electronic component, a first ground land and a first hot land are provided on a mounting surface of a first substrate. A semiconductor chip is mounted on a first surface and a first ground land and a first hot land are provided on a second surface of a second substrate, and the second surface faces the mounting surface of the first substrate. A three-terminal capacitor is between the first substrate and second substrates. The first ground land of the first substrate and a first ground electrode of the three-terminal capacitor are connected to each other with a solder bump interposed therebetween, the first hot land of the first substrate and a first hot electrode of the three-terminal capacitor are connected to each other with a solder bump interposed therebetween, the first ground land of the second substrate and a second ground electrode of the three-terminal capacitor are connected to each other with a solder bump interposed therebetween, and the first hot land of the second substrate and a second hot electrode of the three-terminal capacitor are connected to each other with a solder bump interposed therebetween.

11 Claims, 9 Drawing Sheets

(51) Int. Cl.
*H01G 4/228* (2006.01)
*H01L 49/02* (2006.01)
*H01G 2/02* (2006.01)
*H01G 4/005* (2006.01)
*H01G 4/232* (2006.01)
*H05K 1/16* (2006.01)
*H01L 23/64* (2006.01)

(52) U.S. Cl.
CPC .............. H01G 4/232 (2013.01); H01L 28/60 (2013.01); *H01L 23/642* (2013.01); *H01L 24/16* (2013.01); *H01L 2224/0401* (2013.01); *H01L 2224/16227* (2013.01); *H01L 2924/15311* (2013.01); *H01L 2924/19041* (2013.01); *H01L 2924/3011* (2013.01); *H01L 2924/3512* (2013.01); *H05K 1/162* (2013.01)

(56) References Cited

FOREIGN PATENT DOCUMENTS

| | | |
|---|---|---|
| JP | 2007-305642 A | 11/2007 |
| JP | 2015-050384 A | 3/2015 |
| WO | 2009/028463 A1 | 3/2009 |

ELECTRONIC COMPONENT AND THREE-TERMINAL CAPACITOR

CROSS REFERENCE TO RELATED APPLICATIONS

This application claims the benefit of priority to Japanese Patent Application No. 2016-221516 filed on Nov. 14, 2016 and is a Continuation Application of PCT Application No. PCT/JP2017/039507 filed on Nov. 1, 2017. The entire contents of each application are hereby incorporated herein by reference.

BACKGROUND OF THE INVENTION

1. Field of the Invention

The present invention relates to an electronic component including a three-terminal capacitor and the three-terminal capacitor.

2. Description of the Related Art

A semiconductor device in which a semiconductor chip is flip-chip mounted on an upper surface of a wiring substrate, for example, a resin interposer, has been known. Discrete components such as a capacitor, a resistor, an inductor, and the like are installed on a rear surface of the interposer (Japanese Unexamined Patent Application Publication No. 2015-50384). The discrete components are arranged in a region overlapping with the semiconductor chip, and are connected to the semiconductor chip with through-holes, wirings, and the like in the interposer interposed therebetween. With such an arrangement, it is possible to reduce inductance of a connection path between the semiconductor chip and the discrete component. In addition, a plurality of electrodes (lands) is arranged in a region of the rear surface of the interposer, where the discrete components are not arranged, and external connection terminals (for example, solder bumps) are arranged on the electrodes, respectively.

The interposer is mounted on another substrate, for example, a motherboard, with the solder bump provided on the rear surface thereof interposed therebetween. The discrete components installed on the rear surface of the interposer are to be arranged between the interposer and the motherboard. A plurality of discrete components installed on the rear surface of the interposer includes a decoupling capacitor.

With only the decoupling capacitor installed on the rear surface of the interposer, there is a case in which a sufficient reduction effect of a high-frequency noise generated in a ground terminal and a hot terminal of the semiconductor chip cannot be obtained. By connecting the semiconductor tip and a decoupling capacitor installed on the motherboard, it is possible to enhance the effect of reducing the high-frequency noise.

SUMMARY OF THE INVENTION

Preferred embodiments of the present invention provide electronic components each including a new connection structure between a semiconductor chip attached to a second wiring substrate (an interposer or the like) mounted on a first wiring substrate (a motherboard or the like) and the first wiring substrate. Preferred embodiments of the present invention also provide three-terminal capacitors each of which is able to be applied to the electronic components.

An electronic component according to a preferred embodiment of the present invention includes a first wiring substrate including a first ground-side land and a first hot-side land provided on a mounting surface; a second wiring substrate on a first surface of which a semiconductor chip is mounted, including a first ground-side land and a first hot-side land provided on a second surface on an opposite side, and mounted on the first wiring substrate in such a posture that the second surface faces the mounting surface of the first wiring substrate; and a three-terminal capacitor which is located between the first wiring substrate and the second wiring substrate and which includes a first ground-side outer electrode, a second ground-side outer electrode, a first hot-side outer electrode, and a second hot-side outer electrode, in which the first ground-side land of the first wiring substrate and the first ground-side outer electrode of the three-terminal capacitor are connected to each other with a solder bump interposed between the first ground-side land of the first wiring substrate and the first ground-side outer electrode of the three-terminal capacitor, the first hot-side land of the first wiring substrate and the first hot-side outer electrode of the three-terminal capacitor are connected to each other with a solder bump interposed between the first hot-side land of the first wiring substrate and the first hot-side outer electrode of the three-terminal capacitor, the first ground-side land of the second wiring substrate and the second ground-side outer electrode of the three-terminal capacitor are connected to each other with a solder bump interposed between the first ground-side land of the second wiring substrate and the second ground-side outer electrode of the three-terminal capacitor, and the first hot-side land of the second wiring substrate and the second hot-side outer electrode of the three-terminal capacitor are connected to each other with a solder bump interposed between the first hot-side land of the second wiring substrate and the second hot-side outer electrode of the three-terminal capacitor.

A current path is provided between the first ground-side land of the first wiring substrate and the first ground-side land of the second wiring substrate connected to a three-terminal capacitor, and a current path is also provided between the first hot-side land of the first wiring substrate and the first hot-side land of the second wiring substrate connected to the three-terminal capacitor. The semiconductor chip and the first ground-side land and the first hot-side land of the first wiring substrate are able to be connected with the current paths interposed therebetween.

In an electronic component according to a preferred embodiment of the present invention, the first wiring substrate includes a second ground-side land and a second hot-side land provided on the mounting surface, the second wiring substrate includes a second ground-side land and a second hot-side land provided on the second surface, the second ground-side land of the first wiring substrate and the second ground-side outer electrode of the three-terminal capacitor are connected to each other with the solder bump interposed between the second ground-side land of the first wiring substrate and the second ground-side outer electrode of the three-terminal capacitor, the second hot-side land of the first wiring substrate and the second hot-side outer electrode of the three-terminal capacitor are connected to each other with the solder bump interposed between the second hot-side land of the first wiring substrate and the second hot-side outer electrode of the three-terminal capacitor, the second ground-side land of the second wiring substrate and the first ground-side outer electrode of the three-terminal capacitor are connected to each other with the solder bump interposed between the second ground-side land of the second wiring substrate and the first ground-side outer electrode of the three-terminal capacitor, and the second hot-side land of the second wiring substrate and the first hot-side outer electrode of the three-terminal capacitor are connected to each other with the solder bump interposed between the second hot-side land of the second wiring substrate and the first hot-side outer electrode of the three-terminal capacitor.

As a result of the solder bump being connected to the first ground-side outer electrode of the three-terminal capacitor, the first ground-side land of the first wiring substrate and the second ground-side land of the second wiring substrate are connected to each other. As a result of the solder bump being connected to the second ground-side outer electrode of the three-terminal capacitor, the second ground-side land of the first wiring substrate and the first ground-side land of the second wiring substrate are connected to each other. As a result of the solder bump being connected to the first hot-side outer electrode of the three-terminal capacitor, the first hot-side land of the first wiring substrate and the second hot-side land of the second wiring substrate are connected to each other. As a result of the solder bump being connected to the second hot-side outer electrode of the three-terminal capacitor, the second hot-side land of the first wiring substrate and the first hot-side land of the second wiring substrate are connected to each other. As a result of these connections, a new current path is provided between the first wiring substrate and the second wiring substrate.

In an electronic component according to a preferred embodiment of the present invention, the three-terminal capacitor has a planar shape in which four corners of a quadrangular shape are chamfered, and four chamfered end surfaces each have a shape matching a shape of a surface of the bump.

The three-terminal capacitor and the solder bumps are able to be connected with ease.

In an electronic component according to a preferred embodiment of the present invention, the first wiring substrate includes a third ground-side land and a third hot-side land provided on the mounting surface, the second wiring substrate includes a third ground-side land and a third hot-side land provided on the second surface, the third ground-side land of the first wiring substrate and the third ground-side land of the second wiring substrate are connected to each other with a solder bump interposed between the third ground-side land of the first wiring substrate and the third ground-side land of the second wiring substrate without being connected to the three-terminal capacitor, the third hot-side land of the first wiring substrate and the third hot-side land of the second wiring substrate are connected to each other with a solder bump interposed between the third hot-side land of the first wiring substrate and the third hot-side land of the second wiring substrate without being connected to the three-terminal capacitor, and a size of each of the first ground-side land and the first hot-side land of the second wiring substrate and the first ground-side land and the first hot-side land of the first wiring substrate is different from a size of each of the third ground-side land and the third hot-side land of the second wiring substrate and the third ground-side land and the third hot-side land of the first wiring substrate.

By making the sizes of the lands different, it is possible to improve or optimize volumes of the solder bump to which the three-terminal capacitor is connected and the solder bump to which the three-terminal capacitor is not connected.

In an electronic component according to a preferred embodiment of the present invention, the three-terminal capacitor includes a ground-side inner electrode and a hot-side inner electrode facing each other interposing a dielectric layer, and a direction in which the ground-side inner electrode and the hot-side inner electrode are separated from each other is parallel or substantially parallel to a direction in which the first wiring substrate and the second wiring substrate are separated from each other.

By setting a posture of the three-terminal capacitor as described above, it is possible to provide the three-terminal capacitor even in a narrow gap between the first wiring substrate and the second wiring substrate.

An electronic component according to a preferred embodiment of the present invention includes a decoupling capacitor installed on a rear surface of the first wiring substrate on an opposite side from the mounting surface, in which the decoupling capacitor is connected to the first ground-side land and the first hot-side land of the first wiring substrate.

By connecting the semiconductor chip and the decoupling capacitor, it is possible to enhance the effect of reducing the high-frequency noise.

In an electronic component according to a preferred embodiment of the present invention, thermal expansion coefficient of the three-terminal capacitor is equal to or smaller than a value obtained by adding 10 ppm/K to a larger thermal expansion coefficient of a thermal expansion coefficient of the first wiring substrate and a thermal expansion coefficient of the second wiring substrate, and equal to or larger than a value obtained by subtracting 10 ppm/K from a smaller thermal expansion coefficient.

It is possible to obtain an effect that cracks caused by a thermal stress hardly occur in the three-terminal capacitor.

In an electronic component according to a preferred embodiment of the present invention, in a case in which thermal expansion coefficients of the three-terminal capacitor, the first wiring substrate, and the second wiring substrate are represented by $\alpha$, $\alpha_1$, and $\alpha_2$, respectively, and a height from a surface of the first wiring substrate to a center of the three-terminal capacitor and a height from a surface of the second wiring substrate to the center of the three-terminal capacitor are represented by $H_1$ and $H_2$, respectively, the thermal expansion coefficient $\alpha$ is a value within a range expressed by a follows formula.

Formula 1

$$\left| \alpha - \left( \alpha_1 \times \frac{H_2}{H_1 + H_2} + \alpha_2 \times \frac{H_1}{H_1 + H_2} \right) \right| \leq 10 \text{ ppm/K} \tag{1}$$

It is possible to obtain an effect that the cracks caused by the thermal stress further hardly occur in the three-terminal capacitor.

A three-terminal capacitor according to a preferred embodiment of the present invention has a planar shape in which four corners of a quadrangular shape are chamfered, in which a ground-side outer electrode or a hot-side outer electrode is provided on an end surface of each of the four corners which are chamfered.

The solder bumps are able to be easily mounted on the four chamfered corners of the quadrangle.

A current path is provided between the ground-side land of the first wiring substrate and the ground-side land of the second wiring substrate connected to the three-terminal capacitor, and a current path is also provided between the hot-side land of the first wiring substrate and the hot-side land of the second wiring substrate connected to the three-terminal capacitor. The semiconductor chip and the ground-side land and the hot-side land of the first wiring substrate are able to be connected with these current paths interposed therebetween.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

An electronic component according to a first preferred embodiment of the present invention will be described with reference to FIGS. 1 to 6.

Figure 1:
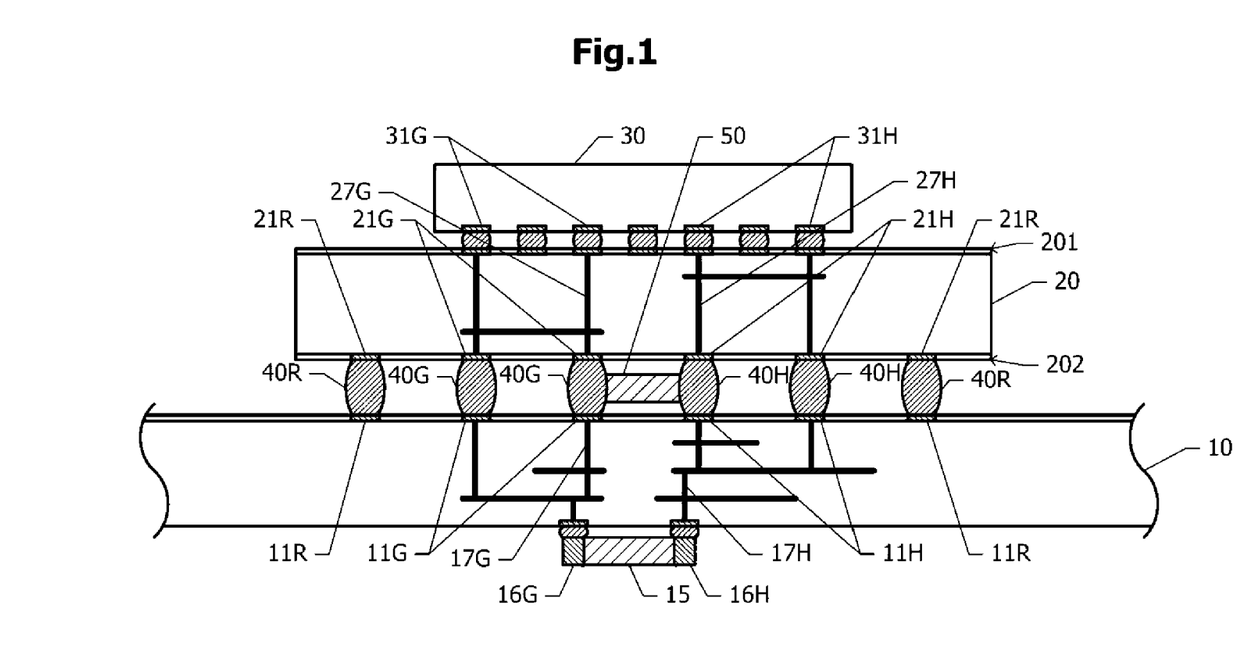
FIG. 1 is a cross-sectional view of an electronic component according to a first preferred embodiment of the present invention.

FIG. 1 is a cross-sectional view of the electronic component according to the first preferred embodiment. The electronic component according to the first preferred embodiment includes a motherboard (first wiring substrate) 10, an interposer (second wiring substrate) 20, and a semiconductor chip 30.

The motherboard 10 includes a plurality of ground-side lands 11G, a plurality of hot-side lands 11H, and a plurality of other lands 11R, provided on a mounting surface. A decoupling capacitor 15 is installed on a rear surface of the motherboard 10 on an opposite side from the mounting surface. A ground-side terminal 16G of the decoupling capacitor 15 is connected to at least one ground-side land 11G with a ground wiring 17G in the motherboard 10 interposed therebetween. The ground wiring 17G includes a ground plane and an interlayer connection via in the motherboard 10. A hot-side terminal 16H of the decoupling capacitor 15 is connected to at least one hot-side land 11H with a power supply wiring 17H in the motherboard 10 interposed therebetween. The power supply wiring 17H includes a power supply plane and an interlayer connection via in the motherboard 10.

The semiconductor chip 30 is mounted on a first surface 201 of the interposer 20. For mounting of the semiconductor chip 30, for example, flip-chip bonding is preferably used. The interposer 20 includes a plurality of ground-side lands 21G, a plurality of hot-side lands 21H, and a plurality of other lands 21R provided on a second surface 202 on an opposite side from the first surface 201.

At least one ground-side land 21G is connected to a ground-side terminal 31G of the semiconductor chip 30 with a ground wiring 27G arranged in the interposer 20 interposed therebetween. At least one hot-side land 21H is connected to a hot-side terminal 31H of the semiconductor chip 30 with a power supply wiring 27H arranged in the interposer 20 interposed therebetween. The interposer 20 is mounted on the motherboard 10 in a posture in which the second surface 202 faces the motherboard 10.

The plurality of ground-side lands 11G of the motherboard 10 and the plurality of ground-side lands 21G of the interposer 20 are connected to each other with ground solder bumps 40G interposed therebetween, respectively. The plurality of hot-side lands 11H of the motherboard 10 and the plurality of hot-side lands 21H of the interposer 20 are connected to each other with hot solder bumps 40H interposed therebetween, respectively. The plurality of other lands 11R of the motherboard 10 and the plurality of other lands 21R of the interposer 20 are connected to each other with solder bumps 40R interposed therebetween, respectively.

A three-terminal capacitor 50 is located in a space between the motherboard 10 and the interposer 20. The three-terminal capacitor 50 includes at least two ground-side outer electrodes and at least two hot-side outer electrodes. The three-terminal capacitor 50 is in contact with two ground solder bumps 40G and two hot solder bumps 40H at end surfaces thereof. In FIG. 1, one ground solder bump 40G and one hot solder bump 40H connected to the three-terminal capacitor 50 are illustrated.

One ground-side land 11G and one hot-side land 11H of the motherboard 10 are connected to one ground-side outer electrode and one hot-side outer electrode of the three-terminal capacitor 50, respectively. Further, one ground-side land 21G and one hot-side land 21H of the interposer 20 are connected to one ground-side outer electrode and one hot-side outer electrode of the three-terminal capacitor 50, respectively. A connection structure between the motherboard 10 and the interposer 20 and the three-terminal capacitor 50 will be described in detail with reference to FIGS. 2A, 2B, 3A, and 3B.

Figure 2A:
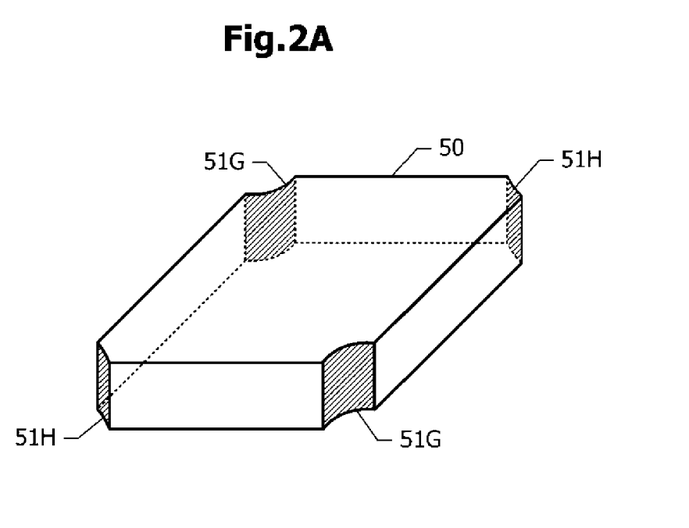
FIG. 2A is a perspective view of a three-terminal capacitor used in the electronic component according to the first preferred embodiment of the present invention.

FIG. 2A is a perspective view of the three-terminal capacitor 50. The three-terminal capacitor 50 has an outer shape whose dimension in a height direction is smaller than dimensions in a longitudinal direction and a lateral direction of a planar shape. Further, the three-terminal capacitor 50 has the planar shape in which four corners of a quadrangular shape are chamfered. Two ground-side outer electrodes 51G and two hot-side outer electrodes 51H are provided on chamfered end surfaces corresponding to the four corners, respectively. The two ground-side outer electrodes 51G are located at positions having a diagonal relation to each other, and the two hot-side outer electrodes 51H are also located at positions having a diagonal relation to each other.

Figure 2B:
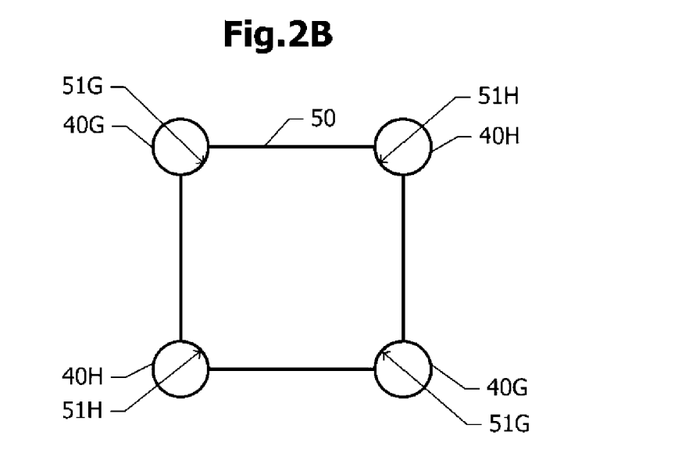
FIG. 2B is a plan view of the three-terminal capacitor and solder bumps.

FIG. 2B is a plan view of the three-terminal capacitor and the solder bumps. The ground solder bumps 40G are respectively mounted on the two ground-side outer electrodes 51G, and the hot solder bumps 40H are respectively mounted on the two hot-side outer electrodes 51H, of the three-terminal capacitor 50. The chamfered end surface of the three-terminal capacitor 50 has a shape that matches a shape of a surface of the solder bump 40G or 40H.

Figure 3A:
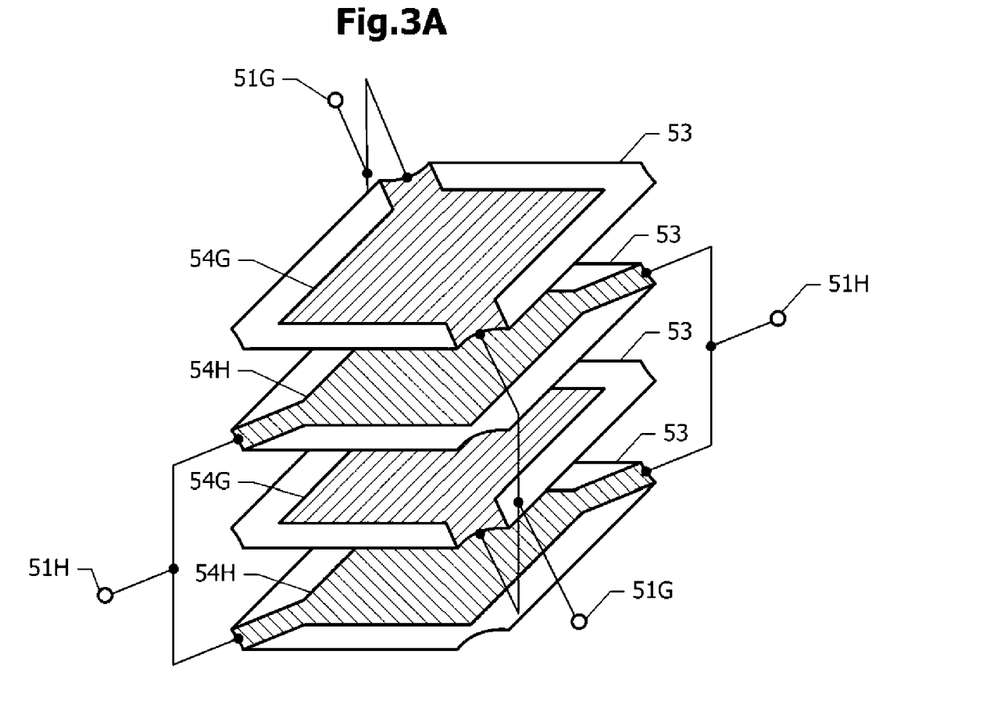
FIG. 3A is an exploded perspective view illustrating a structure of inner electrodes of the three-terminal capacitor.

FIG. 3A is an exploded perspective view illustrating a structure of inner electrodes of the three-terminal capacitor 50. The three-terminal capacitor 50 includes a plurality of laminated dielectric layers 53. For example, a ceramic material can be used for the dielectric layer 53. On each of the dielectric layers 53, a conductor pattern which becomes a ground-side inner electrode 54G or a hot-side inner electrode 54H is printed. The dielectric layer 53 provided with the ground-side inner electrode 54G and the dielectric layer 53 provided with the hot-side inner electrode 54H are alternately laminated.

The ground-side inner electrode 54G includes an extension portion extending to an end surface on which the ground-side outer electrode 51G (FIG. 2A) is located, and is connected to the ground-side outer electrode 51G (FIG. 2A) at a tip of the extension portion. In the same manner, the hot-side inner electrode 54H includes an extension portion extending to an end surface on which the hot-side outer electrode 51H (FIG. 2A) is located, and is connected to the hot-side outer electrode 51H (FIG. 2A) at a tip of the extension portion.

The three-terminal capacitor 50 (FIG. 1) is installed on the motherboard 10 and the interposer 20 in such a posture that a direction in which the ground-side inner electrode 54G and the hot-side inner electrode 54H are separated from each other (vertical direction in FIG. 3A) is parallel or substantially parallel to a direction in which the motherboard 10 and the interposer 20 are separated from each other.

As the three-terminal capacitor 50, a silicon-based capacitor may be used in addition to a multilayer ceramic capacitor.

Figure 3B:
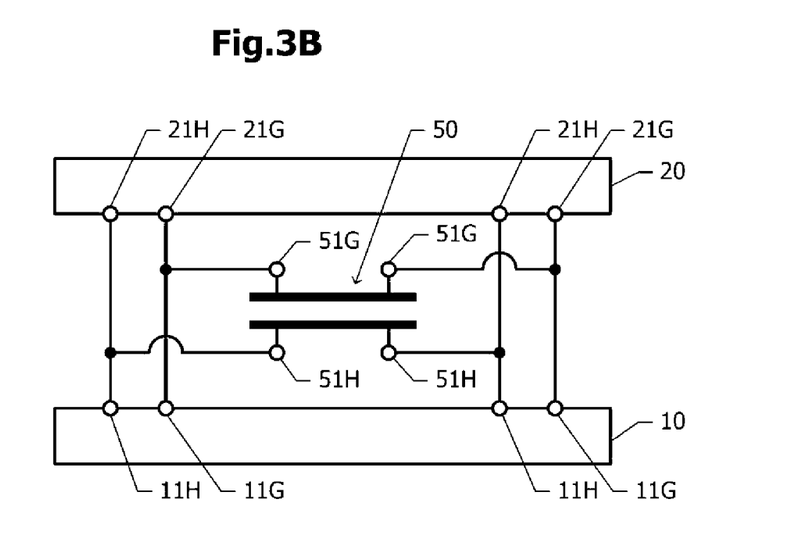
FIG. 3B is an equivalent circuit diagram illustrating a connection configuration of a motherboard 10, an interposer 20, and a three-terminal capacitor 50.

FIG. 3B is an equivalent circuit diagram illustrating a connection configuration of the motherboard 10, the interposer 20, and the three-terminal capacitor 50. One ground-side land 11G of the motherboard 10, one ground-side outer electrode 51G of the three-terminal capacitor 50, and one ground-side land 21G of the interposer 20 are connected to one another by the solder bump. The other ground-side land 11G of the motherboard 10, the other ground-side outer electrode 51G of the three-terminal capacitor 50, and the other ground-side land 21G of the interposer 20 are connected to one another by another solder bump. One hot-side land 11H of the motherboard 10, one hot-side outer electrode 51H of the three-terminal capacitor 50, and one hot-side land 21H of the interposer 20 are connected to one another by still another solder bump. The other hot-side land 11H of the motherboard 10, the other hot-side outer electrode 51H of the three-terminal capacitor 50, and the other hot-side land 21H of the interposer 20 are connected to one another by still another solder bump.

Figure 4:
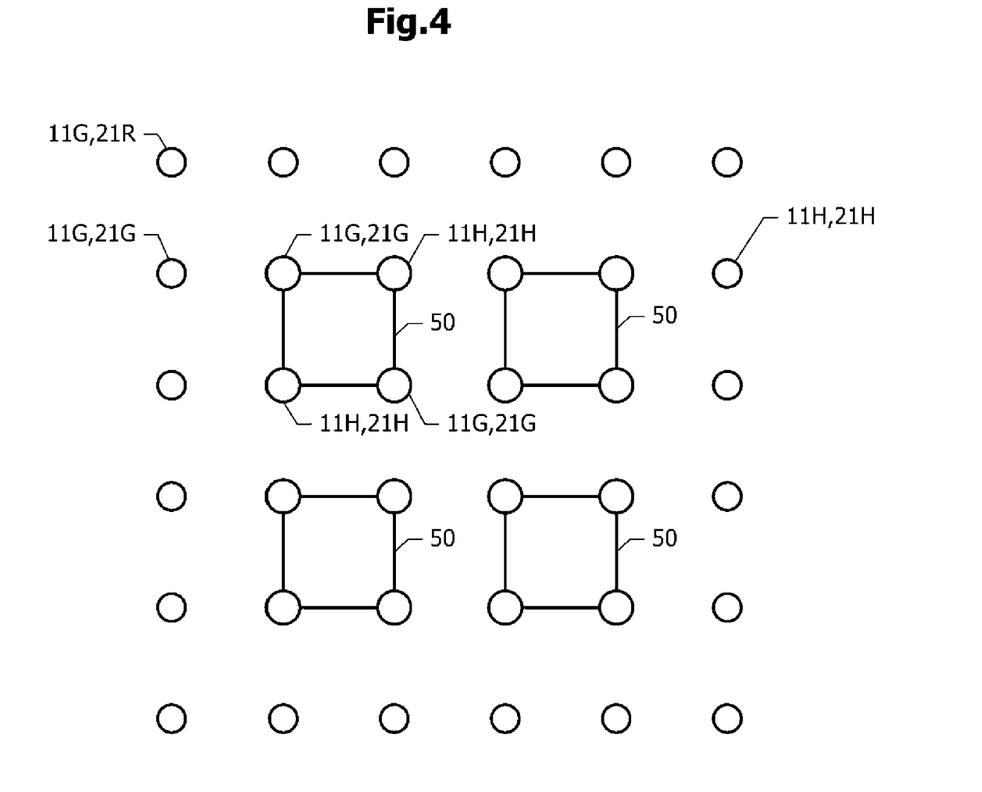
FIG. 4 is a plan view illustrating an arrangement of lands provided on the motherboard and the interposer.

FIG. 4 is a plan view illustrating an arrangement of a plurality of lands provided on the motherboard 10 and the interposer 20. The plurality of lands is located at positions corresponding to intersections of a square lattice. The three-terminal capacitor 50 is located directly below the semiconductor chip 30 (FIG. 1). FIG. 4 illustrates an example in which four three-terminal capacitors 50 are provided. One three-terminal capacitor 50 is approximately equal in size to one unit lattice of the square lattice including the plurality of lands. The ground-side lands 11G and 21G are located at each position of a pair of diagonal positions, and the hot-side lands 11H and 21H are located at each position of the other pair of diagonal positions, of the one unit lattice.

Around a region where the plurality of three-terminal capacitors 50 is located, the ground-side lands 11G and 21G, the hot-side lands 11H and 21H, and the plurality of other lands 11R and 21R that are not connected to the three-terminal capacitor 50 are located. The size of each of the ground-side lands 11G and 21G and the hot-side lands 11H and 21H connected to the three-terminal capacitor 50 differs from the size of each of the ground-side lands 11G and 21G, the hot-side lands 11H and 21H, and the other lands 11R and 21R that are not connected to the three-terminal capacitor. With this, by making the volume of each of the solder bumps 40G and 40H (FIG. 1) connected to the three-terminal capacitor 50 different from the volume of each of the solder bumps 40G, 40H and 40R that are not connected to the three-terminal capacitor 50, improvement or optimization is able to be achieved.

The size of each of these lands depends on a distance between the motherboard 10 and the interposer 20, a size of the three-terminal capacitor 50, and the like. The optimum size of each of these lands is able to be determined by repeating an evaluation experiment.

Next, with reference to FIGS. 5A, 5B, and FIG. 6, excellent effects of the first preferred embodiment will be described.

Figure 5A:
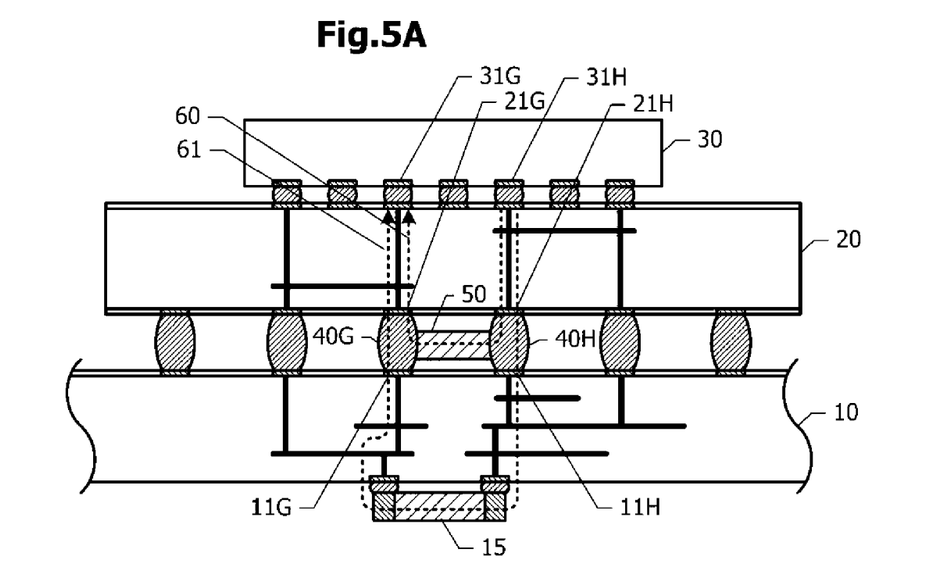
FIG. 5A is a cross-sectional view of the electronic component according to the first preferred embodiment of the present invention.
Figure 5B:
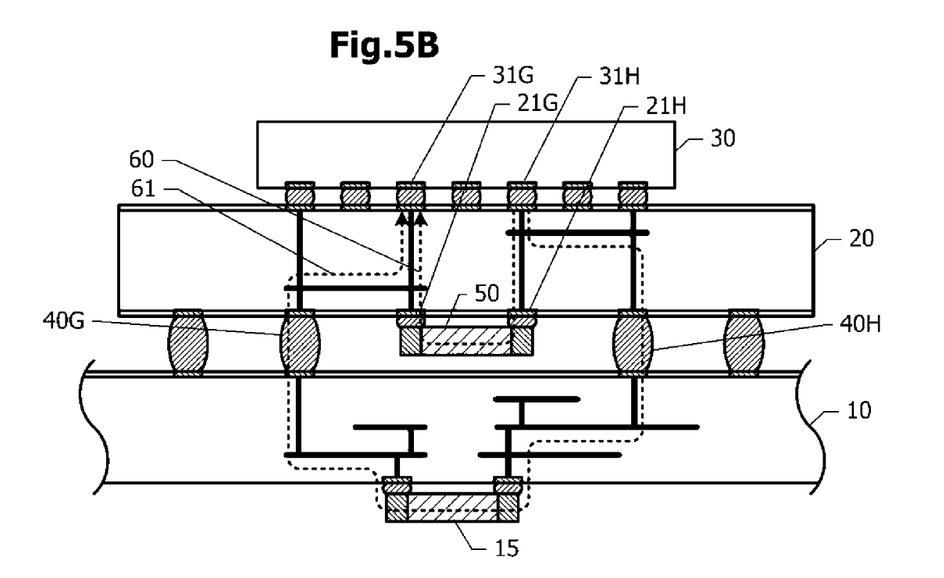
FIG. 5B is a cross-sectional view of an electronic component according to a comparative example.

FIG. 5A is a cross-sectional view of the electronic component according to the first preferred embodiment, and FIG. 5B is a cross-sectional view of an electronic component according to a comparative example.

As illustrated in FIG. 5A, in the electronic component according to the first preferred embodiment, the ground-side land 11G of the motherboard 10 and the ground-side land 21G of the interposer 20 are connected by the solder bump 40G on the ground side connected to the three-terminal capacitor 50. In the same manner, the hot-side land 11H of the motherboard 10 and the hot-side land 21H of the interposer 20 are connected by the solder bump 40H on the hot side connected to the three-terminal capacitor 50.

In the comparative example illustrated in FIG. 5B, the three-terminal capacitor 50 between the motherboard 10 and the interposer 20 is connected to the ground-side land 21G and the hot-side land 21H of the interposer 20, but is not connected to the land of the motherboard 10.

In both of the first preferred embodiment and the comparative example, the decoupling capacitor 15 is located, substantially directly below the three-terminal capacitor 50, on the rear surface of the motherboard 10.

A current path 60 from the hot-side terminal 31H to return to the ground-side terminal 31G of the semiconductor chip 30 via the three-terminal capacitor 50 and a current path 61 from the hot-side terminal 31H to return to the ground-side terminal 31G via the decoupling capacitor 15 are provided. By high-frequency noise generated in the semiconductor chip 30 flowing through the current paths 60 and 61, it is possible to reduce or prevent leakage of the noise to the ground wiring and the power supply wiring in the motherboard 10 and the interposer 20.

In the electronic component according to the first preferred embodiment (FIG. 5A), the current path 61 through the solder bumps 40G and 40H connected to the three-terminal capacitor 50 is provided. However, in the electronic component according to the comparative example (FIG. 5B), a current path flowing from the motherboard 10 to the interposer 20 through the solder bumps connected to the three-terminal capacitor 50 or a current path flowing in a reverse direction thereof is not provided. In the comparative example, since the current path 61 includes the solder bump 40G on the ground side and the solder bump 40H on the hot side around the region in which the three-terminal capacitor 50 is arranged, the current path 61 of the electronic component according to the comparative example is longer than the current path 61 of the electronic component according to the first preferred embodiment. As the current path 61 becomes longer, an inductance component of the current path 61 increases. In other words, in the electronic component according to the first preferred embodiment, the inductance component of the current path 61 is able to be made smaller than that of the electronic component according to the comparative example. As a result, it is possible to reduce a loop impedance of the current path 61.

Figure 6:
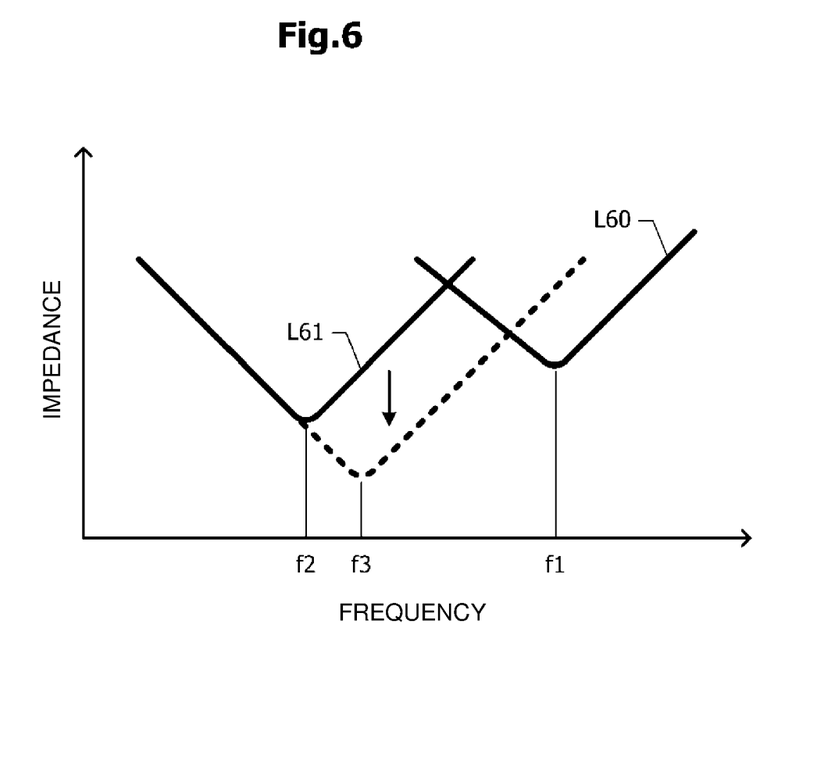
FIG. 6 is a graph showing an example of a loop impedance of a current path connecting a semiconductor chip and a decoupling capacitor.

FIG. 6 is a graph showing an example of the loop impedance of each of the current path 60 and the current path 61. The horizontal axis represents a frequency, and the vertical axis represents the impedance. Solid lines L60 and L61 indicate the loop impedances of the current paths 60 and 61, respectively, of the electronic component according to the comparative example (FIG. 5B).

In both of the current paths 60 and 61, a capacitance component becomes dominant in a frequency range lower than a resonant frequency f1 of the current path 60 and a frequency range lower than a resonant frequency f2 of the current path 61, and the loop impedance decreases as the frequency increases. An inductance component becomes dominant in a frequency range higher than the resonant frequency f1 and a frequency range higher than the resonant frequency f2, and the loop impedance increases as the frequency increases.

In general, since the decoupling capacitor 15 installed on the motherboard 10 has larger capacitance than that of the three-terminal capacitor 50, the resonant frequency f2 of the current path 61 is lower than the resonant frequency f1 of the current path 60.

Since the inductance component of the current path 61 of the electronic component according to the first preferred embodiment (FIG. 5A) is smaller than the inductance component of the current path 61 of the electronic component according to the comparative example (FIG. 5B), a resonant frequency f3 of the current path 61 of the electronic component according to the first preferred embodiment is higher than the resonant frequency f2 of the current path 61 of the electronic component according to the comparative example. Therefore, by using the configuration of the first preferred embodiment, as indicated by a broken line in FIG. 6, the loop impedance of the current path 61 is able to be lowered in a frequency range higher than the resonant frequency f2. With this, it is possible to enhance the effect of reducing the high-frequency noise flowing through the ground wiring and the power supply wiring.

In order to shorten the current path 60 (FIG. 5A), it is preferable to arrange the three-terminal capacitor 50 and the semiconductor chip 30 such that the three-terminal capacitor 50 is included in the semiconductor chip 30 in a plan view. Further, it is more preferable to arrange the three-terminal capacitor 50 and the semiconductor chip 30 such that, in a plan view, the ground-side terminal 31G of the semiconductor chip 30 and the ground-side land 21G connected to the three-terminal capacitor 50 overlap with each other, and the hot-side terminal 31H of the semiconductor chip 30 and the hot-side land 21H connected to the three-terminal capacitor 50 overlap with each other.

In order to shorten the current path 61 (FIG. 5A), it is preferable to arrange the decoupling capacitor 15 and the semiconductor chip 30 such that the decoupling capacitor 15 is included in the semiconductor chip 30 in a plan view. Further, it is preferable to arrange the three-terminal capacitor 50 and the decoupling capacitor 15 such that the three-terminal capacitor 50 and the decoupling capacitor 15 at least partially overlap with each other.

In the three-terminal capacitor 50 installed in the electronic component according to the first preferred embodiment, a dimension in the lamination direction (height direction) of the ground-side inner electrode 54G and the hot-side inner electrode 54H (FIG. 3A) is smaller than dimensions in two directions orthogonal thereto. By making the direction in which the ground-side inner electrode 54G and the hot-side inner electrode 54H are separated from each other (height direction) parallel to the direction in which the motherboard 10 and the interposer 20 are separated from each other, it is possible to narrow the distance between the motherboard 10 and the interposer 20.

Since the four corners of the three-terminal capacitor 50 are chamfered, the solder bumps 40G and 40H (FIG. 2B) can be easily mounted on the three-terminal capacitor 50 as compared with a case in which edges are left at the four corners. In addition, in a process of mounting the interposer 20 on the motherboard 10 using the flip-chip bonding technique, the three-terminal capacitor 50 is able to be mounted.

For example, the solder bump is formed on the land of one of the motherboard 10 and the interposer 20 by screen printing or the like. At this time, no solder bump is formed on the ground-side land and the hot-side land connected to the three-terminal capacitor 50. Prior to a reflow process, the three-terminal capacitor 50, on which the solder bumps 40G and 40H (FIG. 2B) are mounted, is placed in a predetermined position. Then, by performing the reflow process, the solder bump and the three-terminal capacitor 50 are able to be mounted on one of the motherboard 10 and the interposer 20.

Alternatively, after forming the solder bumps on all lands, the three-terminal capacitor 50 on which the solder bumps are not mounted (FIG. 2A) may be arranged at a predetermined position, and the reflow process may be performed.

Second Preferred Embodiment

Next, with reference to FIGS. 7A and 7B, an electronic component according to a second preferred embodiment of the present invention will be described. Hereinafter, description of a configuration common to the electronic component according to the first preferred embodiment will be omitted. Although, in the first preferred embodiment, the direction in which the ground-side inner electrode 54G and the hot-side inner electrode 54H of the three-terminal capacitor 50 (FIG. 3A) are separated from each other is parallel or substantially parallel to the direction in which the motherboard 10 and the interposer 20 are separated from each other, in the second preferred embodiment, the two directions are perpendicular or substantially perpendicular to each other.

Figure 7A:
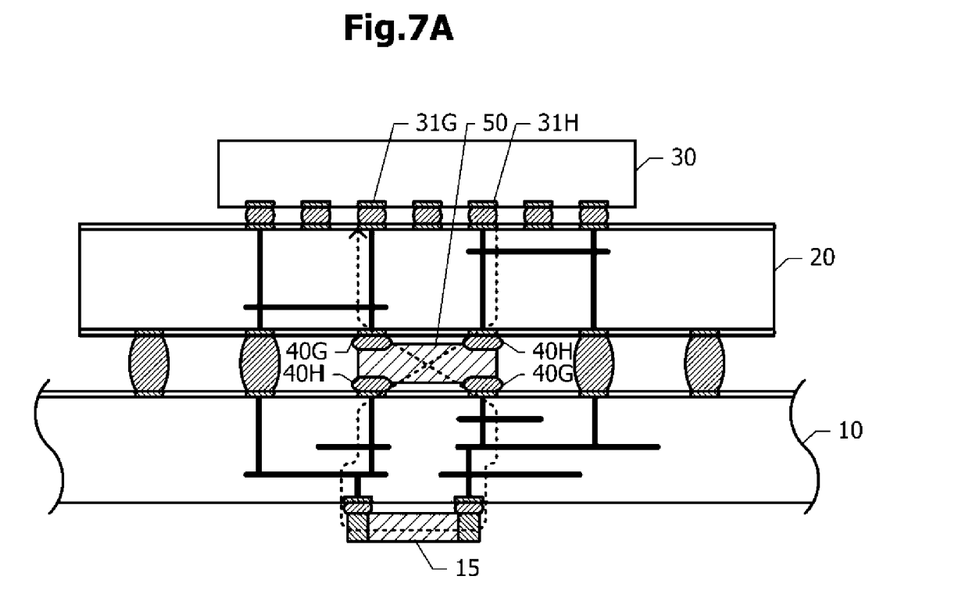
FIG. 7A is a cross-sectional view of an electronic component according to a second preferred embodiment of the present invention.
Figure 7B:
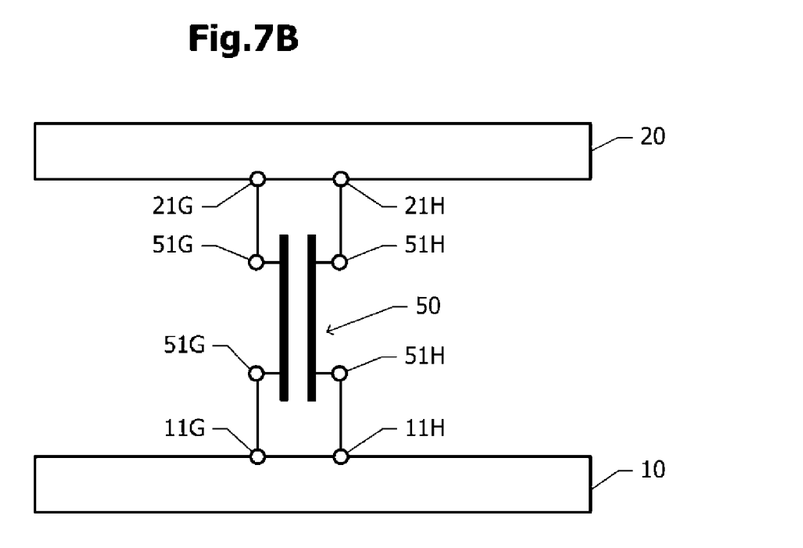
FIG. 7B is an equivalent circuit diagram illustrating a connection configuration of a three-terminal capacitor, a motherboard, and an interposer.

FIG. 7A is a cross-sectional view of the electronic component according to the second preferred embodiment, and FIG. 7B is an equivalent circuit diagram illustrating a connection configuration of the three-terminal capacitor 50, the motherboard 10, and the interposer 20. One ground-side outer electrode 51G of the three-terminal capacitor 50 is connected to the ground-side land 11G of the motherboard 10 with the solder bump 40G interposed therebetween, and the other ground-side outer electrode 51G is connected to the ground-side land 21G of the interposer 20 with the other solder bump 40G interposed therebetween. In the same manner, one hot-side outer electrode 51H of the three-terminal capacitor 50 is connected to the hot-side land 11H of the motherboard 10 with the solder bump 40H interposed therebetween, and the other hot-side outer electrode 51H is connected to the hot-side land 21H of the interposer 20 with the other solder bump 40H interposed therebetween.

A path from the one ground-side outer electrode 51G to the other ground-side outer electrode 51G through the ground-side inner electrode 54G (FIG. 3A) and a path from the one hot-side outer electrode 51H to the other hot-side outer electrode 51H through the hot-side inner electrode 54H (FIG. 3A), of the three-terminal capacitor 50, define a portion of the current path 61 from the hot-side terminal 31H to return to the ground-side terminal 31G of the semiconductor chip 30 through the decoupling capacitor 15. In other words, the high-frequency noise flowing through the current path 61 always passes through the ground-side inner electrode 54G and the hot-side inner electrode 54H of the three-terminal capacitor 50.

In the second preferred embodiment as well, in the same manner as in the first preferred embodiment, the loop impedance of the current path 61 passing through the decoupling capacitor 15 installed on the motherboard 10 is able to be reduced. With this, it is possible to enhance the effect of reducing the high-frequency noise which appears in the ground wiring and the power supply wiring.

Third Preferred Embodiment

Next, with reference to FIGS. 8A and 8B, an electronic component according to a third preferred embodiment of the present invention will be described. Hereinafter, description of a configuration common to the electronic component according to the first preferred embodiment will be omitted.

Figure 8A:
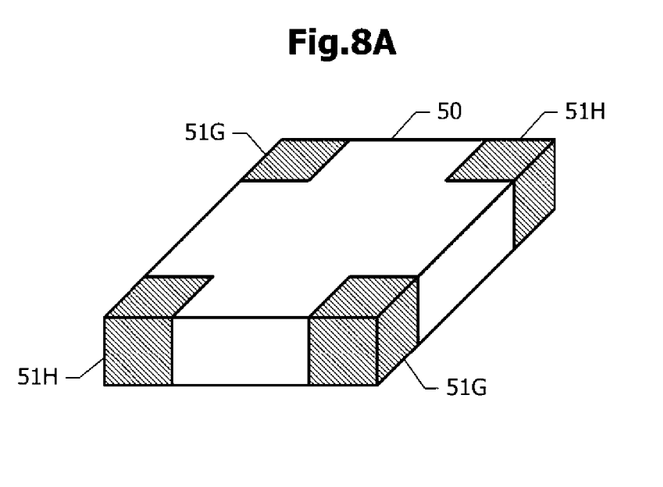
FIG. 8A is a perspective view of a three-terminal capacitor used in an electronic component according to a third preferred embodiment of the present invention.

FIG. 8A is a perspective view of the three-terminal capacitor used in the electronic component according to the third preferred embodiment. Although, in the first preferred embodiment, the four corners of the three-terminal capacitor 50 (FIG. 2A) are chamfered, in the third preferred embodiment, the three-terminal capacitor 50 has an approximately rectangular parallelepiped shape without being chamfered.

In a plan view, outer electrodes are respectively provided in four regions including four corners of the three-terminal capacitor 50. The ground-side outer electrodes 51G are located in two regions having a diagonal relation to each other, and the hot-side outer electrodes 51H are located in the other two regions having a diagonal relation to each other. Each of the two ground-side outer electrodes 51G and the two hot-side outer electrodes 51H extends from a partial region of a bottom surface to a partial region of an upper surface through partial regions of two side surfaces of the three-terminal capacitor 50.

Figure 8B:
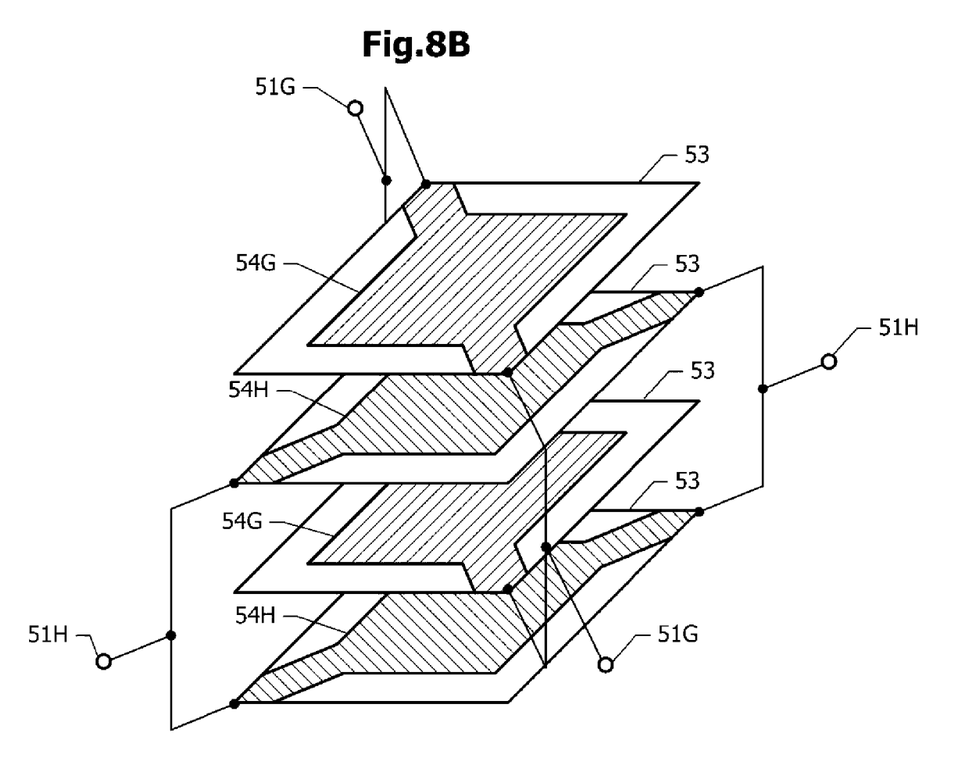
FIG. 8B is an exploded perspective view illustrating a structure of inner electrodes of the three-terminal capacitor.

FIG. 8B is an exploded perspective view illustrating a structure of inner electrodes of the three-terminal capacitor 50. The lamination structure of the dielectric layer 53, the ground-side inner electrode 54G, and the hot-side inner electrode 54H is the same as the lamination structure of the three-terminal capacitor 50 of the first preferred embodiment (FIG. 3A). Although, in the first preferred embodiment, the four corners of the dielectric layer 53 are cut off, in the third preferred embodiment, each dielectric layer 53 has a rectangular or square planar shape.

In the electronic component according to the third preferred embodiment, for example, the solder bumps are respectively located between the ground-side outer electrodes 51G and the hot-side outer electrodes 51H on the upper surface of the three-terminal capacitor 50 and the interposer 20 (FIG. 1), and other solder bumps are respectively located between the ground-side outer electrodes 51G and the hot-side outer electrodes 51H formed on the bottom surface of the three-terminal capacitor 50 and the motherboard 10 (FIG. 1). The solder bumps in contact with the three-terminal capacitor 50 are smaller than the solder bumps that are located between the motherboard 10 and the interposer 20 without making contact with the three-terminal capacitor 50.

In the same manner as the electronic component according to the first preferred embodiment, the electronic component according to the third preferred embodiment is also able to enhance the effect of reducing the high-frequency noise flowing through the ground wiring and the power supply wiring.

Fourth Preferred Embodiment

Next, with reference to FIG. 9, an electronic component according to a fourth preferred embodiment of the present invention will be described. The electronic component according to the fourth preferred embodiment has the same structure as that of the electronic component according to the first preferred embodiment. In other words, the electronic component according to the fourth preferred embodiment includes the motherboard (first wiring substrate) 10, the interposer (second wiring substrate) 20, the semiconductor chip 30, and the three-terminal capacitor 50 (FIG. 1). In the fourth preferred embodiment, a preferred value of a thermal expansion coefficient of the three-terminal capacitor 50 is clarified.

Figure 9:
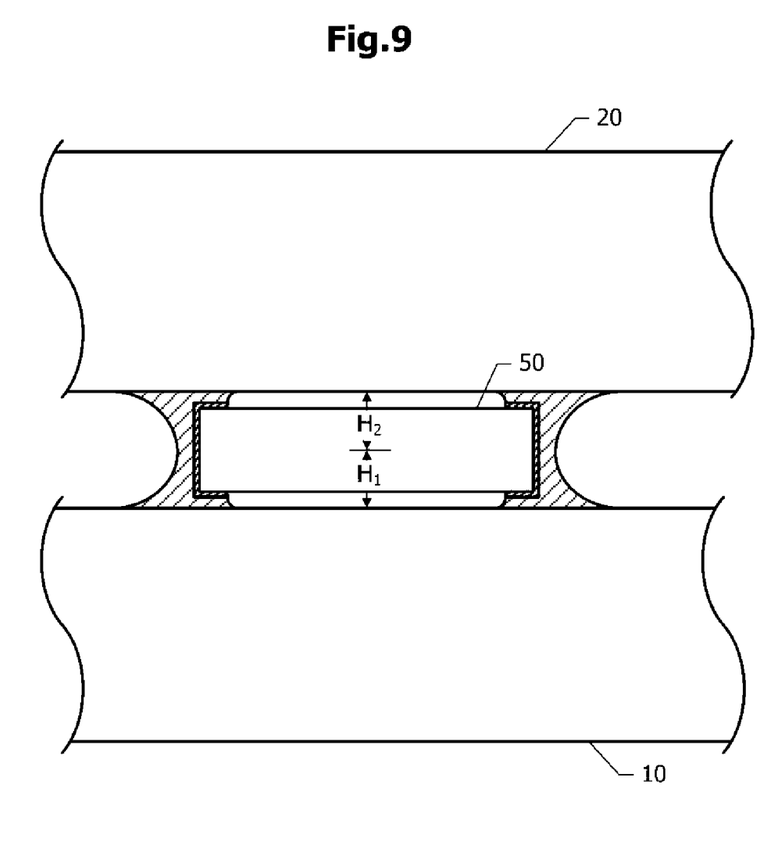
FIG. 9 is a partial cross-sectional view of an electronic component according to a fourth preferred embodiment of the present invention.

FIG. 9 is a partial cross-sectional view of the electronic component according to the fourth preferred embodiment. The three-terminal capacitor 50 is mounted between the motherboard and the interposer 20. Under an environment in which temperature change is repeated by thermal shock (heat shock) or a temperature cycle test, a thermal stress is generated in the three-terminal capacitor 50 due to a difference in the thermal expansion coefficient among the motherboard 10, the interposer 20, and the three-terminal capacitor 50. Due to this thermal stress, cracks may occur in the three-terminal capacitor 50. As in the first preferred embodiment, in a case in which the three-terminal capacitor 50 is sandwiched between the motherboard 10 and the interposer 20, the cracks are more likely to occur compared with a structure of mounting on a surface of one printed boards.

In addition, as a material of the interposer 20, a material which has a thermal expansion coefficient close to that of the semiconductor chip 30 made of silicon or the like has been developed. For example, the thermal expansion coefficient of the motherboard 10 made of FR4 or the like is approximately 16.5 ppm/K, whereas the thermal expansion coefficient of the interposer 20 is approximately equal to or larger than 5 ppm/K and equal to or smaller than 7 ppm/K. When the thermal expansion coefficients of the two elements are different from each other as described above, cracks are likely to occur in the three-terminal capacitor 50.

Next, a relationship among the thermal expansion coefficients of the three-terminal capacitor 50, the motherboard 10, and the interposer 20 will be described. The thermal expansion coefficient of the three-terminal capacitor 50 is represented by α, the thermal expansion coefficient of the motherboard 10 is represented by $α_1$, and the thermal expansion coefficient of the interposer 20 is represented by $α_2$. Here, the thermal expansion coefficient means a coefficient of linear expansion in an in-plane direction. The thermal expansion coefficient α of the three-terminal capacitor 50 means a thermal expansion coefficient as a whole by integrating the dielectric layer 53, the ground-side inner electrode 54G, and the hot-side inner electrode 54H. In the fourth preferred embodiment, α is set to a value which is equal to or smaller than a value obtained by adding 10 ppm/K to a larger one of $α_1$ and $α_2$, and which is equal to or larger than a value obtained by subtracting 10 ppm/K from a value of a smaller one.

Next, an excellent effect of the electronic component according to the fourth preferred embodiment will be described.

In the fourth preferred embodiment, by setting the thermal expansion coefficient α of the three-terminal capacitor 50 as described above, it is possible to reduce the thermal stress generated in the three-terminal capacitor 50. As a result, it is possible to obtain an effect that the cracks hardly occur in the three-terminal capacitor 50.

Next, a relationship between a height at which the three-terminal capacitor 50 is located and a preferable thermal expansion coefficient will be described. The three-terminal capacitor 50 is susceptible to thermal expansion of the one of the motherboard 10 and the interposer 20 which is spatially closer to the three-terminal capacitor. For this reason, it is preferable that the thermal expansion coefficient α of the three-terminal capacitor 50 be made to approach the thermal expansion coefficient of the one of the motherboard 10 and the interposer 20 which is spatially closer to the three-terminal capacitor.

A height from the surface of the motherboard 10 to the center of the three-terminal capacitor 50 is represented by $H_1$, and a height from the surface of the interposer 20 to the center of the three-terminal capacitor 50 is represented by $H_2$. In this case, it is preferable that the thermal expansion coefficient α be set so as to satisfy the following formula.

Formula 2

$$\left| α - \left( α_1 \times \frac{H_2}{H_1 + H_2} + α_2 \times \frac{H_1}{H_1 + H_2} \right) \right| \leq 10 \text{ ppm/K} \quad (2)$$

By setting the thermal expansion coefficient α of the three-terminal capacitor 50 within a range satisfying the formula (2), the cracks are less likely to occur in the three-terminal capacitor 50.

The preferred embodiments described above are merely examples, and partial replacements or combinations of configurations illustrated among different preferred embodiments are also possible. The same actions and effects in the same configurations in a plurality of preferred embodiments are not stated for each preferred embodiment. Furthermore, the present invention is not intended to be limited to the above-described preferred embodiments. For example, it will be obvious to those skilled in the art that various changes, improvements, combinations, or the like can be made.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component comprising:
    a first wiring substrate including a first ground-side land and a first hot-side land provided on a mounting surface;
    a second wiring substrate including a first surface and a first ground-side land and a first hot-side land provided on a second surface on an opposite side, the second wiring substrate being mounted on the first wiring substrate such that the second surface faces the mounting surface of the first wiring substrate;
    a semiconductor chip mounted on the first surface of the second wiring substrate; and
    a three-terminal capacitor between the first wiring substrate and the second wiring substrate and including a first ground-side outer electrode, a second ground-side outer electrode, a first hot-side outer electrode, and a second hot-side outer electrode; wherein
    the first ground-side land of the first wiring substrate and the first ground-side outer electrode of the three-terminal capacitor are connected to each other with a first solder bump interposed between the first ground-side land of the first wiring substrate and the first ground-side outer electrode of the three-terminal capacitor;
    the first hot-side land of the first wiring substrate and the first hot-side outer electrode of the three-terminal capacitor are connected to each other with a second solder bump interposed between the first hot-side land of the first wiring substrate and the first hot-side outer electrode of the three-terminal capacitor;
    the first ground-side land of the second wiring substrate and the second ground-side outer electrode of the three-terminal capacitor are connected to each other with a third solder bump interposed between the first ground-side land of the second wiring substrate and the second ground-side outer electrode of the three-terminal capacitor; and
    the first hot-side land of the second wiring substrate and the second hot-side outer electrode of the three-terminal capacitor are connected to each other with a solder bump interposed between the first hot-side land of the second wiring substrate and the second hot-side outer electrode of the three-terminal capacitor.

2. The electronic component according to claim 1, wherein
    the first wiring substrate includes a second ground-side land and a second hot-side land provided on the mounting surface;
    the second wiring substrate includes a second ground-side land and a second hot-side land provided on the second surface;
    the second ground-side land of the first wiring substrate and the second ground-side outer electrode of the three-terminal capacitor are connected to each other with the first solder bump interposed between the second ground-side land of the first wiring substrate and the second ground-side outer electrode of the three-terminal capacitor;
    the second hot-side land of the first wiring substrate and the second hot-side outer electrode of the three-terminal capacitor are connected to each other with the second solder bump interposed between the second hot-side land of the first wiring substrate and the second hot-side outer electrode of the three-terminal capacitor;

the second ground-side land of the second wiring substrate and the first ground-side outer electrode of the three-terminal capacitor are connected to each other with the third solder bump interposed between the second ground-side land of the second wiring substrate and the first ground-side outer electrode of the three-terminal capacitor; and the second hot-side land of the second wiring substrate and the first hot-side outer electrode of the three-terminal capacitor are connected to each other with the fourth solder bump interposed between the second hot-side land of the second wiring substrate and the first hot-side outer electrode of the three-terminal capacitor.

3. The electronic component according to claim 1, wherein the three-terminal capacitor has a planar shape in which four corners of a quadrangular shape are chamfered, and four chamfered end surfaces each have a shape matching a shape of a surface of one of the first, second, third, and fourth bumps.

4. The electronic component according to claim 1, wherein the first wiring substrate includes a third ground-side land and a third hot-side land provided on the mounting surface;

the second wiring substrate includes a third ground-side land and a third hot-side land provided on the second surface;

the third ground-side land of the first wiring substrate and the third ground-side land of the second wiring substrate are connected to each other with a fifth solder bump interposed between the third ground-side land of the first wiring substrate and the third ground-side land of the second wiring substrate without being connected to the three-terminal capacitor, the third hot-side land of the first wiring substrate and the third hot-side land of the second wiring substrate are connected to each other with a sixth solder bump interposed between the third hot-side land of the first wiring substrate and the third hot-side land of the second wiring substrate without being connected to the three-terminal capacitor; and a size of each of the first ground-side land and the first hot-side land of the second wiring substrate and the first ground-side land and the first hot-side land of the first wiring substrate is different from a size of each of the third ground-side land and the third hot-side land of the second wiring substrate and the third ground-side land and the third hot-side land of the first wiring substrate.

5. The electronic component according to claim 1, wherein the three-terminal capacitor includes a ground-side inner electrode and a hot-side inner electrode facing each other interposing a dielectric layer, and a direction in which the ground-side inner electrode and the hot-side inner electrode are separated from each other is parallel or substantially parallel to a direction in which the first wiring substrate and the second wiring substrate are separated from each other.

6. The electronic component according to claim 1, further comprising:

a decoupling capacitor installed on a rear surface of the first wiring substrate on an opposite side from the mounting surface; wherein the decoupling capacitor is connected to the first ground-side land and the first hot-side land of the first wiring substrate.

7. The electronic component according to claim 1, wherein a thermal expansion coefficient of the three-terminal capacitor is equal to or smaller than a value obtained by adding 10 ppm/K to a larger thermal expansion coefficient of a thermal expansion coefficient of the first wiring substrate or a thermal expansion coefficient of the second wiring substrate, and equal to or larger than a value obtained by subtracting 10 ppm/K from a smaller thermal expansion coefficient of the thermal expansion coefficient of the first wiring substrate or the thermal expansion coefficient of the second wiring substrate.

8. The electronic component according to claim 7, wherein, in a case in which the thermal expansion coefficients of the three-terminal capacitor, the first wiring substrate, and the second wiring substrate are represented by $\alpha$, $\alpha_1$, and $\alpha_2$, respectively, and a height from a surface of the first wiring substrate to a center of the three-terminal capacitor and a height from a surface of the second wiring substrate to the center of the three-terminal capacitor are represented by $H_1$ and $H_2$, respectively, the thermal expansion coefficient $\alpha$ is a value within a range expressed by:

$$\left| \alpha - \left( \alpha_1 \times \frac{H_2}{H_1 + H_2} + \alpha_2 \times \frac{H_1}{H_1 + H_2} \right) \right| \leq 10 \text{ ppm/K}.$$

9. The electronic component according to claim 1, wherein the first wiring substrate defines a motherboard.

10. The electronic component according to claim 1, wherein the second wiring substrate defines an interposer.

11. The electronic component according to claim 1, wherein additional solder bumps not connected to the three-terminal capacitor are provided and have different volumes than volumes of the first solder bump, the second solder bump, the third solder bump, and the fourth solder bump.

* * * * *